United States Patent [19]

Boyd et al.

[11] 4,193,444

[45] Mar. 18, 1980

[54] ELECTRICAL MOUNTING MEANS FOR THERMAL CONDUCTION

[75] Inventors: Robert L. Boyd, Woodcliff Lake; David C. Hamilton, Ridgewood; Wilmer E. Wood, Fair Lawn; Joseph Fleming, Ramsey, all of N.J.; Raymond Wegmann, Stroudsburg, Pa.

[73] Assignee: Ramsey Controls, Inc., Mahwah, N.J.

[21] Appl. No.: 878,341

[22] Filed: Feb. 16, 1978

[51] Int. Cl.² ............................................. H01L 23/40
[52] U.S. Cl. ................................... 165/76; 165/80 B; 174/16 HS; 357/79.81; 361/388
[58] Field of Search ........................ 165/76, 77, 78, 80, 165/185, DIG. 3, DIG. 7, 80 B, 80 C, 80 D, 80 E; 174/16 HS; 357/79, 81; 361/383, 386, 388

[56] References Cited

U.S. PATENT DOCUMENTS 3,992,653  11/1976  Richardson et al. ................. 361/388

OTHER PUBLICATIONS

Clip on Terminal Strip with Heat Sink, C.Y.LIU, IBM Technical Disclosure Bulletin, vol. 16 No. 4, Sep., 1973.

Primary Examiner—Sheldon Richter
Attorney, Agent, or Firm—Mel K. Silverman; Mahendra A. Gandhi

[57] ABSTRACT

The present invention constitutes an electrical mounting and conduction means having a support element having a generally U-shaped interior surface, the base of the exterior of the support element being in thermal contact with a heat dissipating surface; a carrier element having a generally U-shaped exteriorsurface, the surface having a cross-section of smaller dimension than that of the U-shaped surface of the support element, the carrier element being nestable within the support element; and locking means removably securable to adjacent arm members of each of the support and carrier elements for maintaining the support and carrier elements in selective securement to each other.

15 Claims, 6 Drawing Figures

ELECTRICAL MOUNTING MEANS FOR THERMAL CONDUCTION

BACKGROUND OF THE INVENTION

The present invention relates to holding and heat dissipation means for modules of electrical systems. Particularly, the present invention defines an apparatus and method of joining heat-generating modules of a system in order to dissipate heat from the main frame members of such systems. The applicable area of classification is believed to be U.S. Class 361, Sub-class 388.

The design goals of any electro-mechanical system include reliability of performance, serviceability, and efficiency in use of space.

System reliability is dependent upon component failure rate, i.e., the life span of most electrical components is closely related to the temperature at which they operate. In order to hold temperature within acceptable limits, it is often necessary to transfer heat from active heat generating components to passive heat dissipative bodies.

The fundamental problem in transferring heat from one body to another is that of providing a path of thermal conduction between such bodies. This can and has been accomplished by utilizing suitable thermal conducting materials, such as a ductile metal providing, however, that the interface surfaces are designed so that, when pressed together with a predetermined force, the area of metal-to-metal contact will permit a sufficient heat flow or thermal conductivity.

The most common method of achieving proper interface pressures has been through the use of screw fasteners installed with special tools for monitoring of torque. While this procedure has been adequate when applied during initial assembly, under controlled conditions, it has proven unable to insure that a proper torque will be maintained during usage and servicing of the modules. For example, insufficient torque will often result in interfaces developing an unacceptable thermal resistance. Conversely, excessive torque may cause structural failure at a critical surface of the electrical system. Further, an otherwise properly torqued fastener will, over a period of time and due to cyclic thermal expansion and contraction of joint components, eventually loosen, thereby causing an increase, over time, of thermal resistance at a possibly critical interface. A further disadvantage of the prior art approach relates to the manhours which are required in order to perform torque-controlled assembly techniques. Also, package designs must consider space allotment for both screw fasteners and the tools necessary to install them.

SUMMARY OF THE INVENTION

The present invention comprises a support element having a generally U-shaped interior surface, the base of the exterior of said support element being in thermal contact with a heat dissipating surface; a carrier element having a generally U-shaped exterior surface, said surface having a cross-section of smaller dimension than that of said U-shaped surface of said support element, said carrier element being nestable within said support element; and locking means removably securable to adjacent arm members of each of said support and carrier elements for maintaining said support and carrier elements in selective securement to each other.

An object of the invention is to provide a new and improved joining method having a high thermal conductivity.

It is a further object of the present invention to provide a joining method which will maintain a desired interface pressure even when subject to a continuous or cyclical thermal expansion and contraction.

It is a yet further object to provide a joining method that will demonstrate repeatable and predictable performance without necessity for use of special tools or specially trained personnel.

It is a still further object to provide a joining method capable of rapid assembly and disassembly.

It is a yet further object to provide a joining method that can be polarized in order to preclude the possibility of an incorrect assembly.

It is a further object to provide a joining method which will require little or no additional space over that occupied by the members being joined.

Yet further objects will become evident from the hereinafter set forth drawings and description thereof.

DETAILED DESCRIPTION OF THE INVENTION

Figure 1:
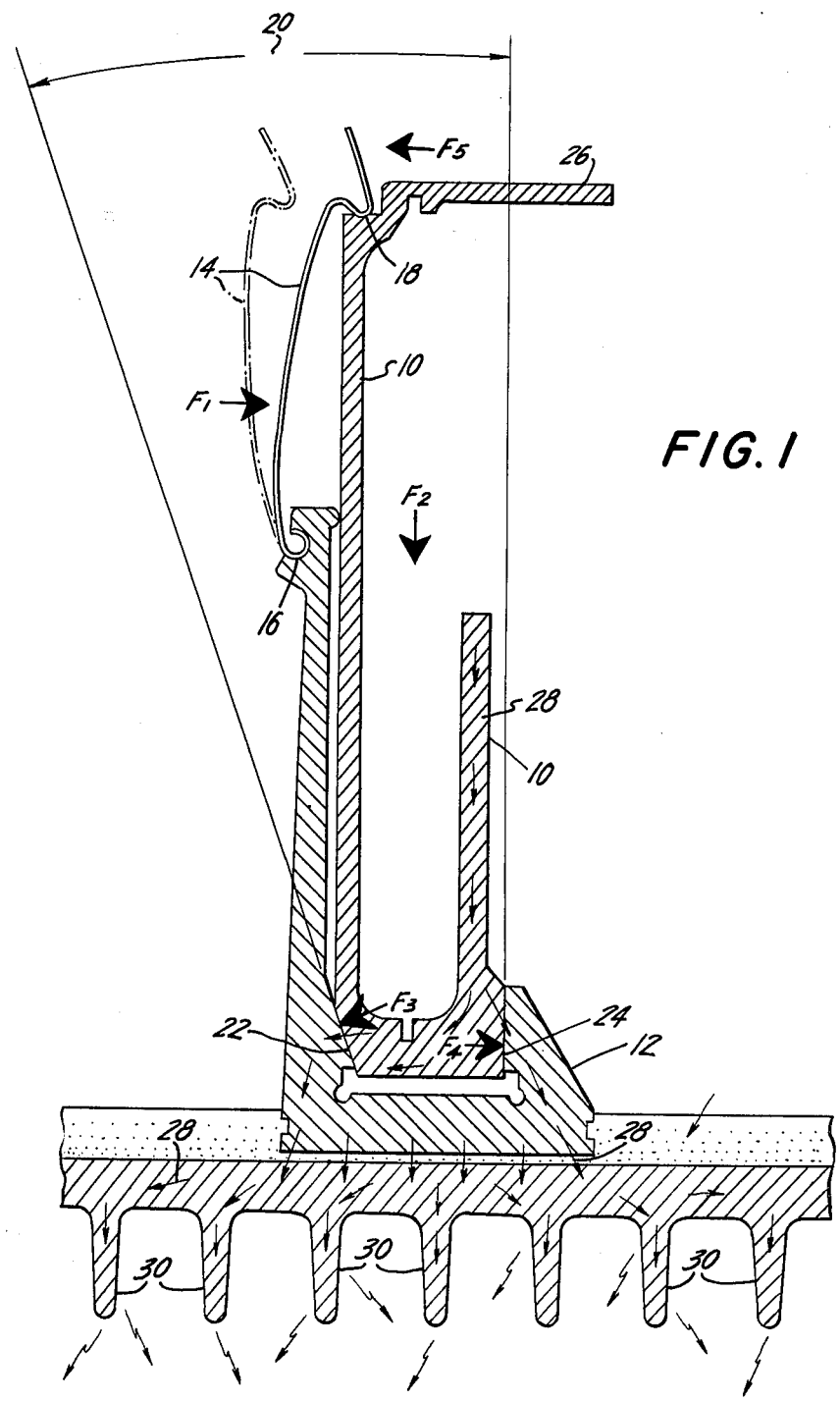
FIG. 1 is a schematic illustration of a first embodiment of the present invention.

With reference now to FIG. 1, it is to be noted that a carrier element 10 comprises a plug-in module which acts as a carrier for heat generating components. The carrier 10, which is generally U-shaped, is nested within a heat dissipating support element 12, which is also generally U-shaped.

A tension spring 14 is pivotably attached at point 16 of the support element 12 and is free to pivot about said point. A groove 18 is provided in the carrier 10 in order to accept one end of the spring 14 when said spring is in a latched position. Further, said spring is designed so that, in order to reach the groove 18, it must be stretched from its free length. This stretching is accomplished by a manual application of pressure F1, which pressure causes an increase in the effective length of the spring and pushes it into the groove 18. When the pressure F1 is released, the spring returns to its free length and the resulting tension, which holds the spring 14 seated in the groove 18, exerts a constant force F2 that draws the carrier and dissipator elements together. Force F2 amplifies the wedge effect of taper angle 20, thereby transmitting forces F3 and F4 to interface surfaces 22 and 24 of the heat dissipating support element 12.

Additionally, the taper of the interface guides the carrier 10 during its initial engagement with element 12. Further, its assymetric form will insure against an incorrect respective orientation of the elements 10 and 12.

In order to disengage the carrier 10 from the heat dissipating support element 12, a pressure F5 is manually applied to the end of the spring, causing it to lift out of the groove 18, thereby releasing the holding forces F3 and F4.

Certain other features of the present invention are to be appreciated; namely, a handle 26 is provided for the carrier 10; this provides a lever action which will assist the force F5 and, generally, aid in disconnecting the carrier 10 from the heat dissipating element 12.

Additionally, in FIG. 1, various paths of thermal conduction are indicated by arrows 28.

With further respect to FIG. 1, it is to be noted that the heat dissipating support element 12 may be secured to a multiplicity of fins 30. See also FIG. 5. From the fins 30, the thermal values are radiated and convected into the ambient atmosphere.

Figure 2:
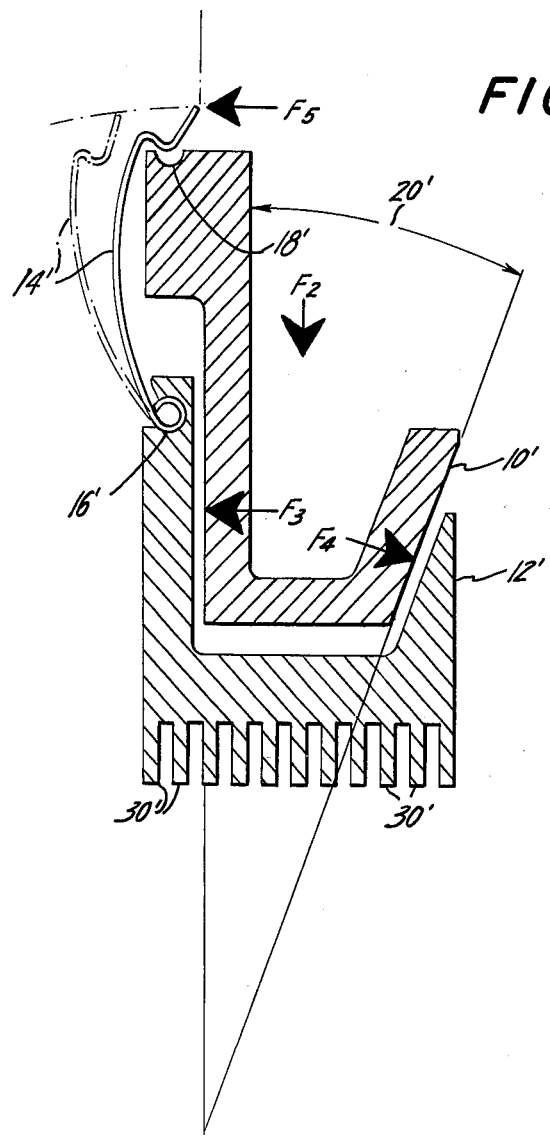
FIG. 2 is a schematic illustration of a second embodiment of the present invention.

With respect to FIG. 2, it is to be noted that the heat dissipating support element comprises a form in which fins 30' are incorporated into the heat dissipating element 12'.

Figure 3:
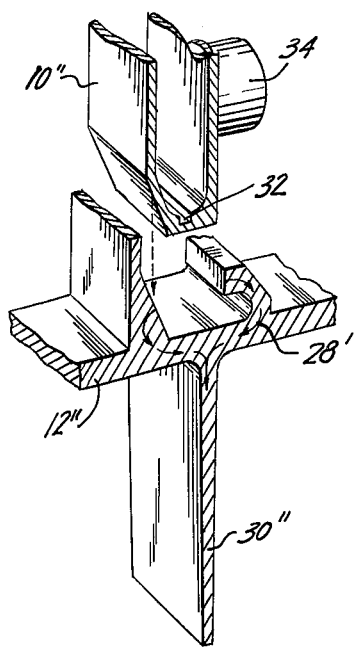
FIG. 3 is a schematic illustration of a third embodiment of the present invention.

With reference now to FIG. 3, yet another embodiment of the present invention is shown; in this embodiment the carrier 10" is provided with a slot 32 into which a printed circuit board may be placed. Also, a control element such as an SCR 34, or other heat generating element, may be positioned upon the carrier 10". Additionally, the support element 12" is shown in a modified form in which an external aluminum fin 30" is shown centrally positioned with respect to the cavity of the dissipator 12". This configuration permits maximum thermal transfer to the fin 30".

Figure 4:
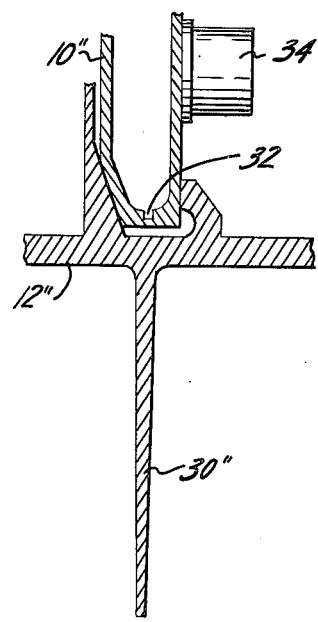
FIG. 4 is a side cross-sectional view of FIG. 3.

FIG. 4 is a side view of FIG. 3 illustrating the embodiment of FIG. 3 in which the carrier and module are in secured relationship.

Figure 5:
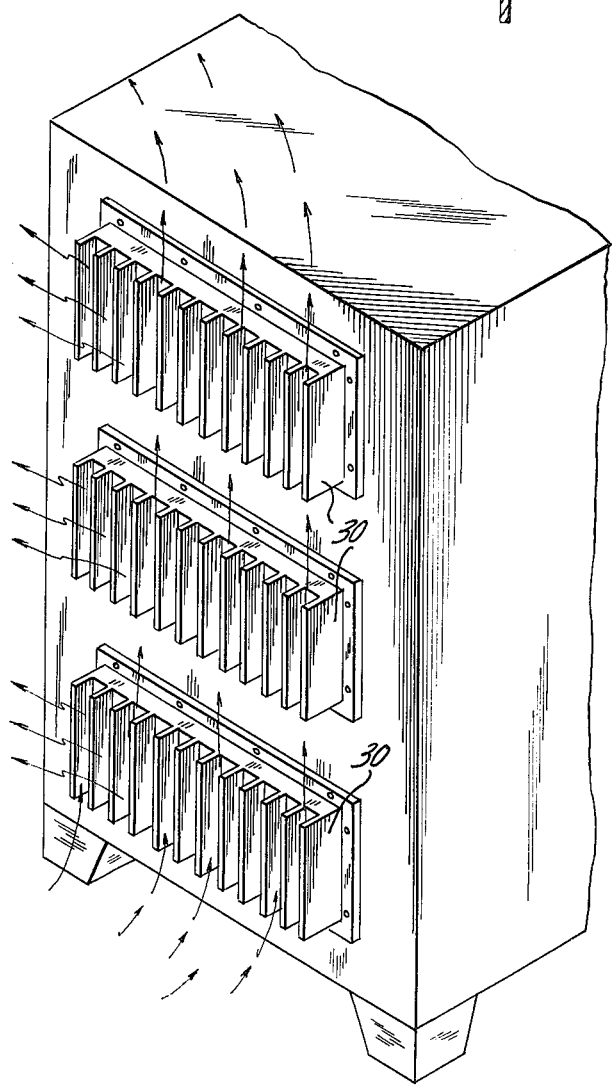
FIG. 5 is a perspective view of the external surface of an electrical enclosure utilizing the present invention.

Regarding FIG. 5, it is noted that the ultimate thermal transfer is to the outside of an electrical enclosure utilizing, therein, the structure of the present invention. It is to be noted that heat is dissipated from the fins by both radiation and convection.

Figure 6:
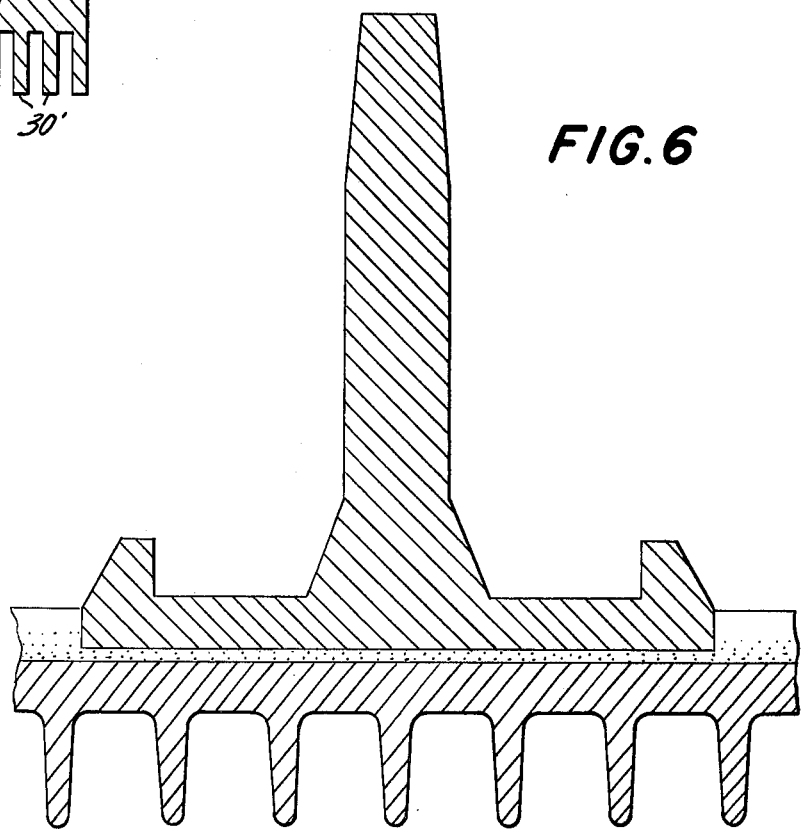
FIG. 6 is a schematic illustration of a fourth embodiment of the present invention.

In FIG. 6 is shown a further embodiment of the present invention in which the support element comprises two symmetric U-shaped surfaces having, basically, the form of an inverted T. Each of said U-shaped surfaces may accommodate a carrier element.

While there have been herein shown and described the preferred embodiments of the present invention, it will be understood that the invention may be embodied otherwise than as herein illustrated and described and that within said embodiments certain changes in detail and construction, in the form and arrangement of the parts, may be made without departing from the underlying idea or principles of this invention within the scope of the appended claims.

What is claimed is:

1. An electrical mounting and thermal conduction means, comprising:
   (a) a support element having a generally U-shaped interior surface, the base of the exterior of said support element being in thermal contact with a heat dissipating surface;
   (b) a carrier element having a generally U-shaped exterior surface, said surface having a cross-section of smaller dimension than that of said U-shaped surface of said support element, said carrier element being nestable within said support element; and
   (c) locking means removably securable to adjacent arm members of each of said support and carrier elements for maintaining said support and carrier elements in selective securement to each other.

2. The mounting and conduction means as recited in claim 1 in which said carrier element further comprises at least one arm, said arm having a greater elongation than the adjacent arm of said support element.

3. The mounting and conduction means as recited in claim 1 in which said support element exhibits an essentially L-shaped cross section.

4. The mounting and conduction means as recited in claim 3 in which said locking means exhibits a pivotable communication with one of said adjacent arm members and a pressure-friction communication with the opposite of said adjacent arm members.

5. The mounting and conduction means as recited in claim 1 in which the nestable interface between said support and carrier elements defines an assymetrical mating surface, thereby insuring that a proper orientation of said support element with respect to said carrier element is attained.

6. The mounting and conduction means as recited in claim 5 in which said carrier element exhibits, in integral communication with the longer arm thereof, a lever arm, wherein ease of removal of said carrier element from said support element is obtained.

7. The mounting and conduction means as recited in claim 1 in which said locking means comprises a tension spring having a spring constant which, in combination with a taper surface of assymetric form, will produce a predetermined and constant force configuration upon said interface.

8. The mounting and conduction means as recited in claim 7 in which said tension spring comprises a plurality of such tension springs.

9. The mounting and conduction means as recited in claim 1 in which said heat dissipating surface comprises a single fin structure through which all thermal values carried through said carrier element will pass.

10. The mounting and conduction means as recited in claim 1 in which said heat dissipating surface comprises a plurality of fin structures.

11. The mounting and conduction means as recited in claim 10 in which said support element and said fin structures are disposed in integral communication.

12. The mounting and conduction means as recited in claim 1 in which said carrier element, at the interior of the base thereof, is provided with a longitudinal cross-sectional slot adapted for press-fitable receipt of a printed circuit board.

13. The mounting and conduction means as recited in claim 1 in which each element thereof is formed of aluminum.

14. The mounting and conduction means as recited in claim 1 in which said carrier element may accommodate electrical elements both within its U-shaped surface and in integral external attachment to either arm thereof.

15. An electrical mounting and thermal conduction means, comprising:
   (a) a support element having two symmetrically disposed and generally U-shaped interior surfaces, the base of the exterior of said support element being in thermal contact with a heat dissipating surface, the cross-section of the exterior surface of said support element thereby exhibiting the shape of an inverted T;
   (b) two carrier elements, each having a generally U-shaped exterior surface, said surfaces having a cross-section of smaller dimension than that of said U-shaped surfaces of said support element, said carrier elements being nestable within the respective U-shaped surfaces of said support element; and
   (c) locking means removably securable to adjacent arm members of each of said support and carrier elements for maintaining said support and carrier elements in selective securement to each other.

* * * * *